(12) United States Patent
Andreas et al.

(10) Patent No.: US 6,399,492 B1
(45) Date of Patent: Jun. 4, 2002

(54) RUTHENIUM SILICIDE PROCESSING METHODS

(75) Inventors: Michael T. Andreas, Boise; Paul A. Morgan, Kuna, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/810,008

(22) Filed: Mar. 15, 2001

(51) Int. Cl.⁷ .................................................. H01L 21/44
(52) U.S. Cl. ........................................ 438/682; 438/686
(58) Field of Search .................................. 438/682, 686

(56) References Cited

U.S. PATENT DOCUMENTS

| | | | |
|---|---|---|---|
| 5,750,290 A | * 5/1998 | Yasuzato et al. | 430/5 |
| 5,962,716 A | 10/1999 | Uhlenbrock et al. | 556/16 |
| 6,063,705 A | * 5/2000 | Vaartstra | 438/686 |
| 6,074,945 A | * 6/2000 | Vaartstra et al. | 438/686 |
| 6,090,697 A | * 7/2000 | Xing et al. | 438/618 |
| 6,114,557 A | 9/2000 | Uhlenbrock et al. | 556/21 |
| 6,133,159 A | 10/2000 | Vaartstra et al. | 438/758 |
| 6,153,490 A | * 11/2000 | Xing et al. | 438/396 |
| 6,281,125 B1 | * 8/2001 | Vaartstra et al. | 438/686 |
| 6,284,655 B1 | * 9/2001 | Marsh | 438/686 |
| 6,313,035 B1 | * 11/2001 | Sandhu et al. | 438/686 |
| 6,342,446 B1 | * 1/2002 | Smith et al. | 438/686 |
| 2001/0006245 A1 | * 7/2001 | Yunogami et al. | 257/513 |

* cited by examiner

Primary Examiner—John F. Niebling
Assistant Examiner—Lynne A. Gurley
(74) Attorney, Agent, or Firm—Wells St. John P.S.

(57) ABSTRACT

The invention includes methods of processing ruthenium silicide. In one implementation, a ruthenium silicide processing method sequentially includes forming ruthenium silicide over front and back sides of a semiconductor substrate. The backside ruthenium silicide is exposed to a chlorine and fluorine containing aqueous solution effective to remove at least some ruthenium silicide therefrom. Then, the substrate backside is exposed to an aqueous ruthenium oxide etchant solution. Then, the substrate backside is exposed to an aqueous hydrofluoric acid containing solution.

44 Claims, 1 Drawing Sheet

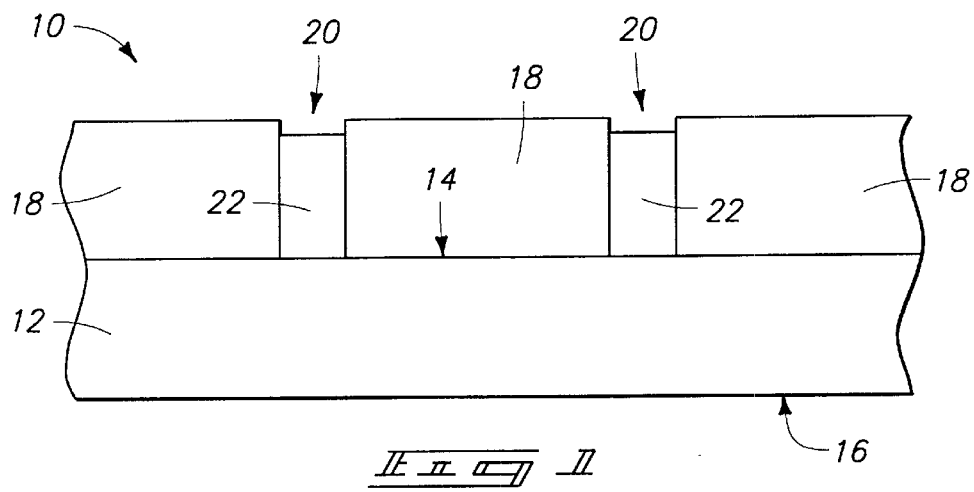
_Fig. 1_
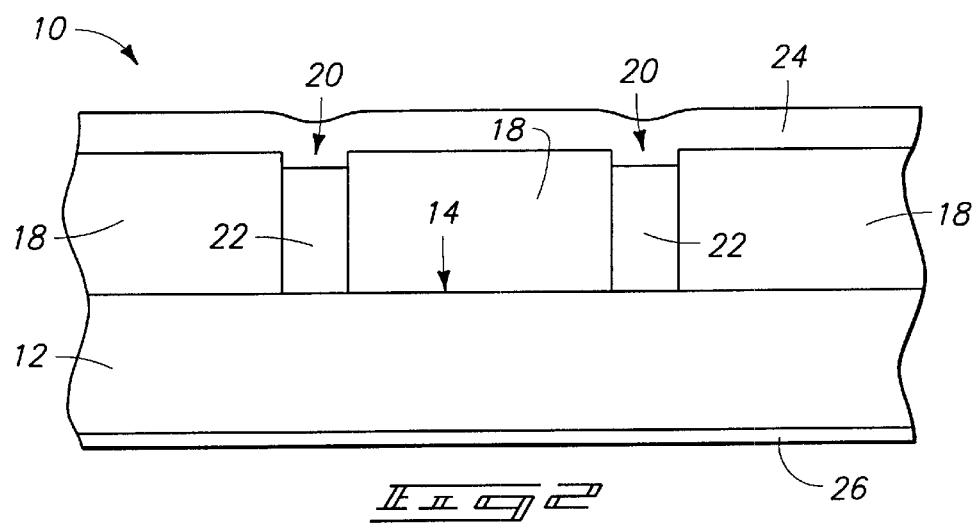
_Fig. 2_
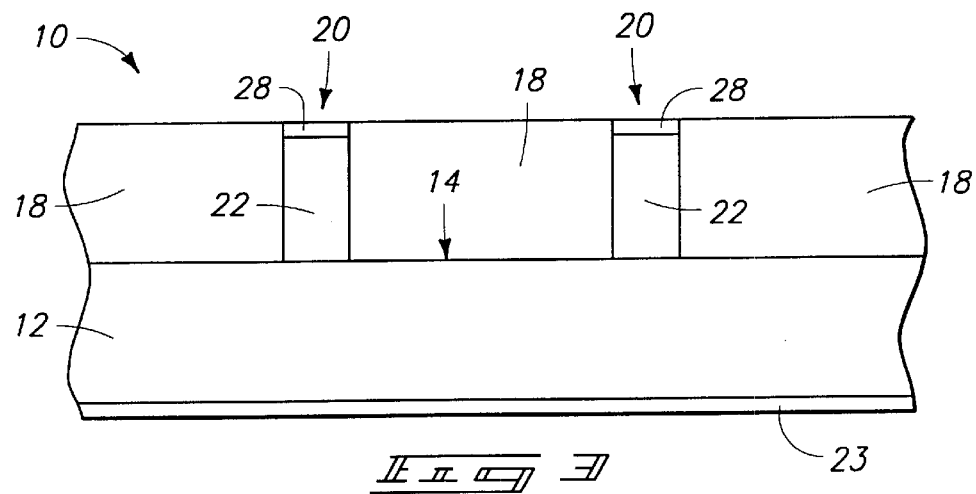
_Fig. 3_

RUTHENIUM SILICIDE PROCESSING METHODS

TECHNICAL FIELD

This invention relates to methods of processing ruthenium silicide.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One way of increasing cell capacitance is through cell structure techniques. Such techniques include three-dimensional cell capacitors, such as trenched or stacked capacitors. Yet, as feature size continues to become smaller and smaller, development of improved materials for cell dielectrics, as well as the cell structure, are important.

Highly integrated memory devices are expected to require a very thin dielectric film for the three-dimensional capacitor of cylindrically stacked or trenched structures. To meet this requirement, and beyond, the capacitor dielectric thickness will be below 2.5 nm of $SiO_2$ equivalent thickness. Chemical vapor deposited (CVD) high k dielectric materials, for example tantalum pentoxide, barium strontium titanate, barium titanate, lead zirconium titanate, strontium bismuth tantalate and others, are considered to be very promising cell dielectric layers for this purpose. The dielectric constants of these materials are typically three times or more greater than that of conventional $Si_3N_4$ based capacitor dielectric layers. However, one drawback associated with dielectric layers such as these is undesired leakage current characteristics. Accordingly, although these materials inherently have higher dielectric properties, as-deposited they typically produce unacceptable results due to excessive leakage current.

This is typically overcome by exposing such layers to extreme oxidizing conditions to result in significant densification. Undesirably, however, such has a tendency to form a $SiO_2$ layer intermediate or between the lower electrode (typically a metal in a metal-insulator-metal capacitor) and an underlying lower electrode connection (typical polysilicon).

One prior art technique of addressing this problem is to form a conductive barrier layer, for example ruthenium silicide, intermediate the lower silicon material and the metal electrode. A preferred technique for forming a ruthenium silicide barrier layer is by CVD. However, the CVD process typically also deposits ruthenium silicide on the edges and backside of the wafer. This excess ruthenium silicide might be dislodged in later processing, and is accordingly desirably removed from the substrate surface at some point after processing the ruthenium silicide on the wafer front side and passing the wafer to further processing steps. Unfortunately, ruthenium silicide is presently a very difficult material to remove from the substrate by chemical etching. Accordingly, it has heretofore been very difficult to remove ruthenium silicide from the backside of semiconductor substrates to effectively suitable low levels to preclude or reduce significant risks of subsequent contamination.

SUMMARY

The invention includes methods of processing ruthenium silicide. In one implementation, a ruthenium silicide processing method sequentially includes forming ruthenium silicide over front and back sides of a semiconductor substrate. The backside ruthenium silicide is exposed to a chlorine and fluorine containing aqueous solution effective to remove at least some ruthenium silicide therefrom. Then, the substrate backside is exposed to an aqueous ruthenium oxide etchant solution. Then, the substrate backside is exposed to an aqueous hydrofluoric acid containing solution.

BRIEF DESCRIPTION OF THE DRAWINGS

Preferred embodiments of the invention are described below with reference to the following accompanying drawings.

FIG. 1 is a diagrammatic sectional view of an exemplary semiconductor wafer fragment in process in accordance with an aspect of the invention.

FIG. 2 is a view of the FIG. 1 wafer fragment at a processing step subsequent to that depicted by FIG. 1.

FIG. 3 is a view of the FIG. 1 wafer fragment at a processing step subsequent to that depicted by FIG. 2.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is indicated generally with the reference numeral 10. Such comprises a bulk monocrystalline silicon substrate 12 having a front surface 14 and a back surface 16. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" includes the singular and the plural, unless otherwise indicated.

An electrically insulative layer 18, for example borophosphosilicate glass, is formed over substrate front surface 14. Contact openings 20 have been formed therethrough to substrate 12. Conductive material 22, for example polysilicon and barrier layers, is provided within openings 20, and preferably processed to be slightly recessed below the outermost surface of insulative layer 18. Such provides but one exemplary substrate for subsequent processing in accordance with aspects of the invention. Yet, the invention is in no way so limited, with the processing of the invention being applicable relative to any semiconductor substrate as herein defined.

Referring to FIG. 2, a ruthenium silicide layer 24 is formed over the front side of the substrate, and a ruthenium silicide layer 26 is formed on the back side of the substrate. An example preferred technique for forming a ruthenium silicide layer is by chemical vapor deposition, for example utilizing tricarbonyl (1,3-cyclohexadiene) ruthenium as a precursor within a chemical vapor deposition chamber. More specifically, and by way of example only, this material is preferably kept at 25° C. or slightly warmer in a bubbler, and 50 sccm of an inert gas (such as helium) is passed through the bubbler then to a shower head within the reactor.

Five (5) sccm of silane is also passed to/through the shower head. An exemplary pressure for the deposition is about 3 Torr, with an exemplary wafer temperature being about 200° C. The amount of silane can be varied to incorporate different amounts of silicon into the ruthenium silicide film, with the above example in a 0.1 m³ reactor giving approximately 50% ruthenium and 50% silicon in the ruthenium silicide film. The tricarbonyl (1,3-cyclohexadiene) ruthenium precursor is described in U.S. Pat. No. 5,962,716, resulting from an application filed on Aug. 27, 1998, entitled "Methods For Preparing Ruthenium And Osmium Compounds" and listing Stefan Uhlenbrock and Brian Vaartstra as inventors. U.S. patent application Ser. No. 09/141,240, entitled "Ruthenium Silicide Diffusion Barrier Layers And Methods Of Forming Same", listing Eugene Marsh and Brian Vaartstra as inventors, filed on Oct. 27, 1998, describes an exemplary CVD method for ruthenium silicide using this precursor.

Referring to FIG. 3, front side ruthenium silicide layer 24 is planarized back, for example by chemical-mechanical polishing or resist etch back, leaving conductive ruthenium silicide diffusion barrier layers/regions 28 over contact opening plugging material 22.

In one embodiment, backside ruthenium silicide layer 26 is then is exposed to a chlorine and fluorine containing aqueous solution effective to remove at least some of ruthenium silicide from the backside, and in another embodiment exposed to an aqueous acid solution comprising a hypochlorite salt regardless of fluorine presence in the solution. A preferred solution in both embodiments comprises water, hydrofluoric acid and a hypochlorite salt. Example hypochlorite salts include potassium hypochlorite and calcium hypochlorite, with potassium hypochlorite being more preferred. In one preferred embodiment, such exposing is preferably with an aqueous solution consisting essentially of water, hydrofluoric acid and potassium hypochlorite containing 0.5% potassium hypochlorite, 1.0% hydrofluoric acid and 98.5% deionized water, such percents being by weight. Another preferred solution includes water, hydrofluoric acid and dissolved chlorine gas. One example method of forming such a solution comprises injecting HF gas and $Cl_2$ gas into water. Further by way of example only, another preferred solution includes water, hydrofluoric acid and hypochlorous acid (HOCl).

Processing is preferably conducted at from ambient temperature to 30° C., and at ambient pressure. The front side of the substrate is preferably not treated with the subject solution while the backside is being treated. The most preferred treatment includes spinning the substrate while spraying the backside ruthenium silicide with such solution for preferably from 1–5 minutes, with from 2–3 minutes being more preferred. Further, the preferred processing tool today for spinning and spray applying the subject aqueous solution is a SEZ 0.303 processing tool available from SEZ America of Phoenix, Ariz. A preferred result is to achieve an approximate 1000 Angstrom removal of the ruthenium silicide layer 26. Further, such processing is preferably conducted to be effective to etch ruthenium from the backside of substrate 10 to leave backside surface residual ruthenium at from $5\times10^{11}$ atoms/cm² to $1\times10^{14}$ atoms/cm², for example, as measurable by droplet-scanning surface analyte concentration and inductively coupled plasma mass spectrometry. Processing can otherwise be conducted as described in co-pending U.S. patent application filed on Mar. 5, 2001, entitled "Ruthenium Silicide Wet Etch" and listing Brenda Kraus and Michael Andreas as inventors.

At the conclusion of this processing, at least the substrate backside is preferably rinsed with water, preferably deionized water.

Then, the substrate backside is exposed to an aqueous ruthenium oxide etchant solution. By way of example only, an example includes a solution comprising acetic acid and ceric ammonium nitrate. Preferably, the aqueous solution consists essentially of water, acetic acid and ceric ammonium nitrate. One specific example solution is CR-14 chromium etchant available from Cyantek Corporation of Freemont, California, which is understood to comprise 10% acetic acid, 30% ceric ammonium nitrate and 60% water, all by weight. By way of example only, an alternate aqueous ruthenium oxide etchant solution comprises chromium trioxide and sulfuric acid.

It has not been determined, and is not clear, whether ruthenium oxide is indeed formed on the backside of the substrate prior to or after conducting the first described chlorine and fluorine containing solution treatment. Yet, exposure to ruthenium oxide etchant solutions after the first treatment/exposing is effective to reduce backside ruthenium content. Preferably, the exposing to an aqueous ruthenium oxide etchant solution is effective to etch some ruthenium from the substrate backside surface to leave backside surface residual ruthenium at from $1\times10^{11}$ atoms/cm² to $1\times10^{13}$ atoms/cm². In other words, the preferred second exposing to an aqueous ruthenium oxide etchant solution preferably results in the removal of additional ruthenium either in elemental or compound form from the backside of the substrate. The preferred treatment is again by spinning the substrate while spraying the backside with the subject solution, preferably at ambient or slightly higher temperatures, and at ambient pressure conditions, as described above. The preferred processing time is from 15 seconds to 3 minutes, with from 30 seconds to 1 minute being more preferred. The preferred processor is again the SEZ 303.

At the conclusion of the aqueous ruthenium oxide etchant solution treatment, at least the backside of the substrate is preferably rinsed by spraying with water, preferably deionized water.

Then, the substrate backside is exposed to an aqueous hydrofluoric acid containing solution. Such solution is preferably dilute hydrofluoric acid having 0.5% HF and 99.5% water, by weight. Such processing is also preferably conducted by spinning the substrate while spraying the backside with such solution, as described above. Preferred conditions are ambient temperature to 30° C. and at ambient pressure. Preferred processing time is from 5–100 seconds with about 15 seconds being preferred. Preferably, such processing is effective to further etch ruthenium from the wafer backside to leave backside surface residual ruthenium at no greater than $9\times10^{10}$ atoms/cm². Preferably, this exposing of the substrate comprises exposing to an aqueous solution consisting essentially of water and hydrofluoric acid, for example, and preferably the dilute hydrofluoric acid solution referred to above.

Preferably at the conclusion of the aqueous hydrofluoric acid treatment, at least the backside of the wafer is rinsed with water, preferably deionized water.

Preferably, the substrate backside is then exposed to an aqueous solution comprising sulfuric acid and at least one of ozone and hydrogen peroxide. The preferred exposure to this solution occurs after the hydrofluoric acid treatment, and preferably by dipping the substrate in the desired aqueous solution. An example preferred solution is 2 weight parts concentrated sulfuric acid to 1 weight part of a 30% (by weight) $H_2O_2$ in water solution.

It has been determined that the optimum/best mode preferred process contains three spin-etch steps, with the first being a three minute spray treatment with the above preferred hydrofluoric acid, potassium hypochlorite and water containing solution. This is followed by the most preferred second spin etch treatment for about thirty seconds utilizing the CR-14 fluid, then followed by a 15 second treatment with the preferred 0.5%/99.5% dilute HF solution. This is then most preferably followed by a seven minute treatment in the above preferred 2:1 piranha solution by dipping the substrate. Rinsing is occurred intermediate each of the above steps and at the conclusion of the piranha treatment. Such was determined to produce substantially ruthenium-free wafer backsides (i.e., less than $9 \times 10^9$ atoms/cm$^2$) within instrumentation measurement capabilities without damaging front side ruthenium silicide structures or leaving collateral potassium or cerium contamination.

The patents and patent applications referred to herein are disclosed to demonstrate the state of the art of a skilled artisan, and are incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A ruthenium silicide processing method sequentially comprising:
    forming ruthenium silicide over front and back sides of a semiconductor substrate;
    first exposing the backside ruthenium silicide to a chlorine and fluorine containing aqueous solution effective to remove at least some ruthenium silicide therefrom;
    second exposing the substrate backside to an aqueous ruthenium oxide etchant solution; and
    third exposing the substrate backside to an aqueous hydrofluoric acid containing solution.

2. The method of claim 1 wherein each of the first, second and third exposings comprises spinning the substrate while spraying the backside with the respective solution.

3. The method of claim 1 comprising water rinsing the substrate backside intermediate the first and second exposings, and intermediate the second and third exposings.

4. The method of claim 1 wherein the chlorine and fluorine containing aqueous solution comprises hydrofluoric acid and dissolved chlorine gas.

5. The method of claim 1 wherein the chlorine and fluorine containing aqueous solution comprises hydrofluoric acid and hypochlorous acid.

6. The method of claim 1 wherein the chlorine and fluorine containing aqueous solution comprises hydrofluoric acid and a hypochlorite salt.

7. The method of claim 1 wherein the chlorine and fluorine containing aqueous solution comprises hydrofluoric acid and a potassium hypochlorite salt.

8. The method of claim 1 wherein the aqueous ruthenium oxide etchant solution comprises acetic acid and ceric ammonium nitrate.

9. The method of claim 1 wherein the aqueous ruthenium oxide etchant solution comprises chromium trioxide and sulfuric acid.

10. The method of claim 1 further comprising exposing the substrate backside to an aqueous solution comprising sulfuric acid and at least one of ozone and hydrogen peroxide.

11. The method of claim 1 further comprising exposing the substrate backside to an aqueous solution comprising sulfuric acid and at least one of ozone and hydrogen peroxide after the third exposing.

12. A ruthenium silicide processing method sequentially comprising:
    forming ruthenium silicide over front and back sides of a semiconductor substrate;
    first exposing the backside ruthenium silicide to an aqueous acid solution comprising a hypochlorite salt;
    second exposing the substrate backside to an aqueous ruthenium oxide etchant solution; and
    third exposing the substrate backside to an aqueous hydrofluoric acid containing solution.

13. The method of claim 12 wherein each of the first, second and third exposings comprises spinning the substrate while spraying the backside with the respective solution.

14. The method of claim 12 wherein the aqueous ruthenium oxide etchant solution comprises acetic acid and ceric ammonium nitrate.

15. The method of claim 12 further comprising exposing the substrate backside to an aqueous solution comprising sulfuric acid and at least one of ozone and hydrogen peroxide.

16. The method of claim 12 further comprising exposing the substrate backside to an aqueous solution comprising sulfuric acid and at least one of ozone and hydrogen peroxide after the third exposing.

17. The method of claim 12 wherein the aqueous acid solution comprising a hypochlorite salt comprises hydrofluoric acid and a potassium hypochlorite salt.

18. A ruthenium silicide processing method sequentially comprising:
    forming ruthenium silicide over front and back sides of a semiconductor substrate;
    first exposing the backside ruthenium silicide to an aqueous solution consisting essentially of water, hydrofluoric acid and at least one hypochlorite salt effective to remove at least some ruthenium silicide therefrom;
    second exposing the substrate backside to an aqueous solution consisting essentially of water, acetic acid and ceric ammonium nitrate; and
    third exposing the substrate backside to an aqueous solution consisting essentially of water and hydrofluoric acid.

19. The method of claim 18 wherein each of the first, second and third exposings comprises spinning the substrate while spraying the backside with the respective solution.

20. The method of claim 18 wherein the chlorine and fluorine containing aqueous solution comprises hydrofluoric acid and dissolved chlorine gas.

21. The method of claim 18 wherein the chlorine and fluorine containing aqueous solution comprises hydrofluoric acid and hypochlorous acid.

22. The method of claim 18 wherein the at least one hypochlorite salt comprises a potassium hypochlorite salt.

23. The method of claim 18 further comprising exposing the substrate backside to an aqueous solution comprising sulfuric acid and at least one of ozone and hydrogen peroxide after the third exposing.

24. A ruthenium silicide processing method sequentially comprising:
    forming ruthenium silicide over front and back sides of a semiconductor substrate;
    first exposing the backside ruthenium silicide to a chlorine and fluorine containing aqueous solution effective to etch ruthenium therefrom to leave backside surface residual ruthenium at from $5\times10^{11}$ atoms/$cm^2$ to $1\times10^{14}$ atoms/$cm^2$;

second exposing the substrate backside to an aqueous ruthenium oxide etchant solution effective to etch ruthenium therefrom to leave backside surface residual ruthenium at from $1\times10^{11}$ atoms/$cm^2$ to $1\times10^{13}$ atoms/$cm^2$; and third exposing the substrate backside to an aqueous hydrofluoric acid containing solution effective to etch ruthenium therefrom to leave backside surface residual ruthenium at no greater than $9\times10^{10}$ atoms/$cm^2$.

25. The method of claim 24 wherein the third exposing is effective to leave backside surface residual ruthenium at no greater than $5\times10^{10}$ atoms/$cm^2$.

26. The method of claim 24 wherein the chlorine and fluorine containing aqueous solution comprises hydrofluoric acid and a potassium hypochlorite salt.

27. The method of claim 24 wherein the aqueous ruthenium oxide etchant solution comprises acetic acid and ceric ammonium nitrate.

28. The method of claim 24 further comprising exposing the substrate backside to an aqueous solution comprising sulfuric acid and at least one of ozone and hydrogen peroxide after the third exposing.

29. A ruthenium silicide processing method sequentially comprising:

forming ruthenium silicide over front and back sides of a semiconductor substrate;

polishing the front side ruthenium silicide;

first exposing the backside ruthenium silicide to a chlorine and fluorine containing aqueous solution effective to etch ruthenium therefrom to leave backside surface residual ruthenium at from $5\times10^{11}$ atoms/$cm^2$ to $1\times10^{14}$ atoms/$cm^2$;

second exposing the substrate backside to an aqueous ruthenium oxide etchant solution effective to etch ruthenium therefrom to leave backside surface residual ruthenium at from $1\times10^{11}$ atoms/$cm^2$ to $1\times10^{13}$ atoms/$cm^2$; and third exposing the substrate backside to an aqueous hydrofluoric acid containing solution effective to etch ruthenium therefrom to leave backside surface residual ruthenium at no greater than $9\times10^{10}$ atoms/$cm^2$.

30. A ruthenium silicide processing method sequentially comprising:

positioning a semiconductor substrate in a chemical vapor deposition chamber and providing tricarbonyl (1,3-cyclohexadiene) ruthenium therein effective to deposit ruthenium silicide over front and back sides of the semiconductor substrate;

first exposing the backside ruthenium silicide to a chlorine and fluorine containing aqueous solution effective to remove at least some ruthenium silicide therefrom;

second exposing the substrate backside to an aqueous ruthenium oxide etchant solution; and third exposing the substrate backside to an aqueous hydrofluoric acid containing solution.

31. The method of claim 30 further comprising providing a silane in the chamber with the tricarbonyl (1,3-cyclohexadiene) ruthenium.

32. The method of claim 30 wherein the chlorine and fluorine containing aqueous solution comprises hydrofluoric acid and dissolved chlorine gas.

33. The method of claim 30 wherein the chlorine and fluorine containing aqueous solution comprises hydrofluoric acid and hypochlorous acid.

34. The method of claim 30 wherein the chlorine and fluorine containing aqueous solution comprises hydrofluoric acid and a potassium hypochlorite salt.

35. The method of claim 30 wherein the aqueous ruthenium oxide etchant solution comprises acetic acid and ceric ammonium nitrate.

36. The method of claim 30 wherein the aqueous ruthenium oxide etchant solution comprises chromium trioxide and sulfuric acid.

37. The method of claim 30 further comprising exposing the substrate backside to an aqueous solution comprising sulfuric acid and at least one of ozone and hydrogen peroxide after the third exposing.

38. A ruthenium silicide processing method sequentially comprising:

forming ruthenium silicide over front and back sides of a semiconductor substrate;

spinning the substrate while spraying the backside ruthenium silicide with an aqueous solution comprising hydrofluoric acid and a hypochlorite salt effective to etch ruthenium therefrom to leave backside surface residual ruthenium at from $5\times10^{11}$ atoms/$cm^2$ to $1\times10^{14}$ atoms/$cm^2$;

rinsing the substrate backside with water;

spinning the substrate while spraying the backside with an aqueous solution comprising acetic acid and ceric ammonium nitrate effective to etch ruthenium therefrom to leave backside surface residual ruthenium at from $1\times10^{11}$ atoms/$cm^2$ to $1\times10^{13}$ atoms/$cm^2$;

rinsing the substrate backside with water;

spinning the substrate while spraying the backside with an aqueous hydrofluoric acid containing solution effective to etch ruthenium therefrom to leave backside surface residual ruthenium at no greater than $9\times10^{10}$ atoms/$cm^2$; and exposing the substrate backside to an aqueous solution comprising sulfuric acid and at least one of ozone and hydrogen peroxide.

39. The method of claim 38 wherein the at least one hypochlorite salt comprises a potassium hypochlorite salt.

40. The method of claim 38 wherein the exposing comprises dipping the substrate in the aqueous solution comprising sulfuric acid and at least one of ozone and hydrogen peroxide.

41. The method of claim 38 wherein the spinning the substrate while spraying the backside with the aqueous hydrofluoric acid containing solution is effective to leave backside surface residual ruthenium at no greater than $5\times10^{10}$ atoms/$cm^2$.

42. A ruthenium silicide processing method sequentially comprising:

forming ruthenium silicide over front and back sides of a semiconductor substrate;

spinning the substrate while spraying the backside ruthenium silicide with an aqueous solution consisting essentially of water, hydrofluoric acid and a potassium hypochlorite salt effective to etch ruthenium therefrom to leave backside surface residual ruthenium at from $5\times10^{11}$ atoms/$cm^2$ to $1\times10^{14}$ atoms/$cm^2$;

rinsing the substrate backside with water;

spinning the substrate while spraying the backside with an aqueous solution consisting essentially of water, acetic acid and ceric ammonium nitrate effective to etch ruthenium therefrom to leave backside surface residual ruthenium at from $1\times10^{11}$ atoms/$cm^2$ to $1\times10^{13}$ atoms/$cm^2$;

rinsing the substrate backside with water;

spinning the substrate while spraying the backside with an aqueous hydrofluoric acid containing solution effective to etch ruthenium therefrom to leave backside surface residual ruthenium at no greater than $9\times10^{10}$ atoms/cm$^2$; and exposing the substrate backside to an aqueous solution comprising sulfuric acid and at least one of ozone and hydrogen peroxide.

43. The method of claim 42 wherein the forming comprises positioning a semiconductor substrate in a chemical vapor deposition chamber and providing tricarbonyl (1,3-cyclohexadiene) ruthenium therein effective to deposit ruthenium silicide over front and back sides of the semiconductor substrate.

44. A ruthenium silicide processing method sequentially comprising:

positioning a semiconductor substrate in a chemical vapor deposition chamber and providing tricarbonyl (1,3-cyclohexadiene) ruthenium therein effective to deposit ruthenium silicide over front and back sides of a semiconductor substrate;

spinning the substrate while spraying the backside ruthenium silicide with an aqueous solution consisting essentially of water at about 98.5 weight per cent, hydrofluoric acid at about 1.0 weight percent and a potassium hypochlorite salt at about 0.5 weight per cent effective to etch ruthenium therefrom to leave backside surface residual ruthenium at from $5\times10^{11}$ atoms/cm$^2$ to $1\times10^{14}$ atoms/cm$^2$;

rinsing the substrate backside with water;

spinning the substrate while spraying the backside with an aqueous solution consisting essentially of water, acetic acid and ceric ammonium nitrate effective to etch ruthenium therefrom to leave backside surface residual ruthenium at from $1\times10^{11}$ atoms/cm$^2$ to $1\times10^{13}$ atoms/cm$^2$;

rinsing the substrate backside with water;

spinning the substrate while spraying the backside with an aqueous hydrofluoric acid containing solution effective to etch ruthenium therefrom to leave backside surface residual ruthenium at no greater than $9\times10^{10}$ atoms/cm$^2$; and exposing the substrate backside to an aqueous solution comprising sulfuric acid and at least one of ozone and hydrogen peroxide.

* * * * *

UNITED STATES PATENT AND TRADEMARK OFFICE
CERTIFICATE OF CORRECTION

| | |
|---|---|
| PATENT NO. | : 6,399,492 B1 |
| APPLICATION NO. | : 09/810008 |
| DATED | : June 4, 2002 |
| INVENTOR(S) | : Michael T. Andreas et al. |

It is certified that error appears in the above-identified patent and that said Letters Patent is hereby corrected as shown below:

Column 3, Line 17 Add --(now U.S. Patent No. 6,197,628)-- before "describes".

Column 3, Line 62 Add --Serial No. 09/799,791-- before "filed on".

Column 3, Line 64 Add --(now U.S. Patent No. 6,498,110)-- after "inventors".

Signed and Sealed this

Twenty-second Day of January, 2008

JON W. DUDAS
*Director of the United States Patent and Trademark Office*